(12) United States Patent
Takebayashi et al.

(10) Patent No.: US 12,191,123 B2
(45) Date of Patent: Jan. 7, 2025

(54) WAFER PLACEMENT TABLE

(71) Applicant: NGK Insulators, Ltd., Nagoya (JP)

(72) Inventors: Hiroshi Takebayashi, Handa (JP); Tatsuya Kuno, Nagoya (JP); Seiya Inoue, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 204 days.

(21) Appl. No.: 17/938,388

(22) Filed: Oct. 6, 2022

(65) Prior Publication Data

US 2023/0123870 A1 Apr. 20, 2023

(30) Foreign Application Priority Data

Oct. 19, 2021 (JP) .................................. 2021-171041

(51) Int. Cl.
*H01L 21/683* (2006.01)
*H01J 37/32* (2006.01)
*H01T 23/00* (2006.01)

(52) U.S. Cl.
CPC .... *H01J 37/32724* (2013.01); *H01L 21/6833* (2013.01); *H01J 2237/002* (2013.01); *H01J 2237/2007* (2013.01)

(58) Field of Classification Search
CPC .................. H01L 21/6833; H01J 37/32724
(Continued)

(56) References Cited

U.S. PATENT DOCUMENTS 9,240,340 B2 * 1/2016 Shiraiwa ............. H01L 21/6833
11,257,703 B2 * 2/2022 Kunita .................. H01L 21/683
(Continued)

FOREIGN PATENT DOCUMENTS

CN 112011778 A 12/2020
EP 2 529 790 B1 9/2017
(Continued)

OTHER PUBLICATIONS

Taiwanese Office Action (Application No. 111138328) dated Sep. 19, 2023 (8 pages).
(Continued)

*Primary Examiner* — Jared Fureman
*Assistant Examiner* — Lucy M Thomas
(74) *Attorney, Agent, or Firm* — BURR PATENT LAW, PLLC

(57) ABSTRACT

A wafer placement table includes a ceramic base including an electrode, a cooling base including a coolant flow path formed therein, a bonding layer bonding the ceramic base and the cooling base, a stepped hole penetrating the bonding layer and the cooling base and including an upper hole portion with a small diameter, a lower hole portion with a large diameter, and a hole stepped portion between the upper hole portion and the lower hole portion, the upper hole portion passing through a region in which the coolant flow path is formed, a stepped insulating pipe inserted through the stepped hole and including an upper pipe portion with a small diameter, a lower pipe portion with a large diameter, and a pipe stepped portion between the upper pipe portion and the lower pipe portion; and a connection terminal bonded to the electrode and inserted through the stepped insulating pipe.

10 Claims, 9 Drawing Sheets

(58) Field of Classification Search
USPC .......................................................... 361/234
See application file for complete search history.

(56) References Cited

U.S. PATENT DOCUMENTS

| | | | |
|---|---|---|---|
| 2012/0309237 A1* | 12/2012 | Marzano | ................. H01G 4/35 29/874 |
| 2015/0036261 A1 | 2/2015 | Jindo et al. | |
| 2015/0077895 A1 | 3/2015 | Jindo et al. | |
| 2015/0348814 A1 | 12/2015 | Shiraiwa et al. | |
| 2020/0312684 A1 | 10/2020 | Mine et al. | |
| 2020/0411357 A1 | 12/2020 | Kunita | |
| 2021/0274599 A1 | 9/2021 | Uematsu et al. | |

FOREIGN PATENT DOCUMENTS

| | | |
|---|---|---|
| JP | 2003-115529 A | 4/2003 |
| JP | 2008-047657 A | 2/2008 |
| JP | 5666748 B1 | 2/2015 |
| JP | 5666749 B1 | 2/2015 |
| JP | 2016-051783 A | 4/2016 |
| JP | 2020-161597 A | 10/2020 |
| KR | 10-2015-0136998 A | 12/2015 |
| KR | 10-2020-0121350 A | 10/2020 |

OTHER PUBLICATIONS

Taiwanese Office Action (Application No. 111138328) dated Jun. 15, 2023 (7 pages).
Korean Office Action (Application No. 10-2022-0129593) dated Mar. 11, 2024 (with English translation) (14 pages).
Japanese Office Action (with English translation) dated Jun. 4, 2024 (Application No. 2021-171041).

* cited by examiner

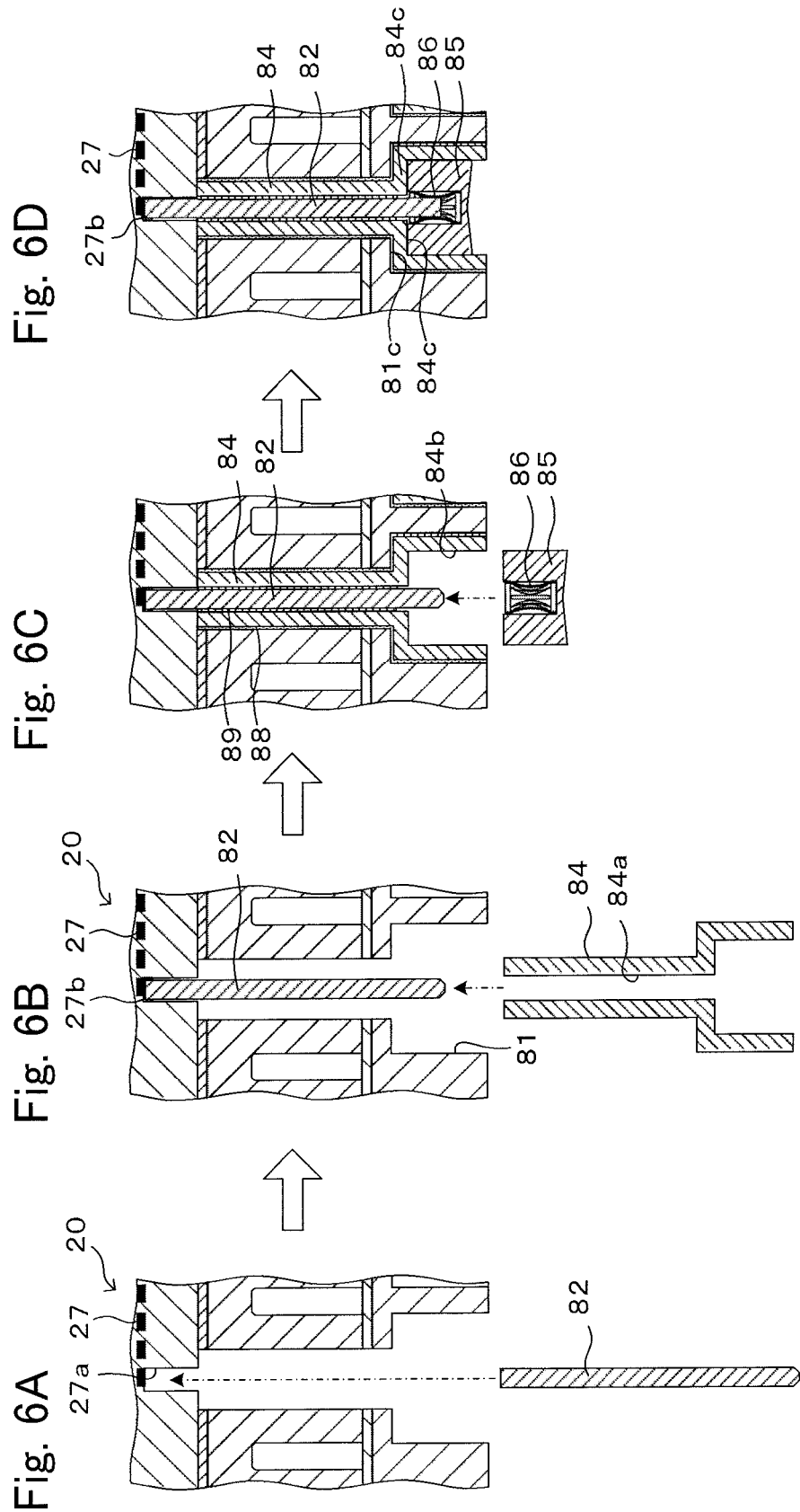

WAFER PLACEMENT TABLE

BACKGROUND OF THE INVENTION

1. Field of the Invention

The present invention relates to a wafer placement table.

2. Description of the Related Art

There is known a wafer placement table in which a ceramic base including an electrostatic electrode embedded therein and a cooling base with a built-in coolant flow path are bonded to each other with a bonding layer interposed between both the bases (see, for example, Patent Literature 1 and 2). A DC voltage can be applied to the electrostatic electrode from an external power supply through a rod-shaped power supply terminal. The power supply terminal passes through a hole penetrating both the cooling base and the bonding layer and reaches the electrostatic electrode after further passing through a hole formed in the ceramic base. An end surface of the power supply terminal is often used as a contact surface for contact with an external contact pin. In consideration of connection to the contact pin, the contact surface needs to have a large area.

CITATION LIST

Patent Literature

PTL 1: Japanese Patent No. 5666748 B
PTL 2: Japanese Patent No. 5666749 B

SUMMARY OF THE INVENTION

However, increasing the area of the contact surface results in an increase in diameter of the power supply terminal and may adversely affect heating uniformity of a wafer in some cases. For instance, when a power supply terminal with a large diameter is disposed, a location at which the power supply terminal with the large diameter is disposed tends to become a hot spot because heat removal performance for a plasma heat input is reduced at such a location.

The present invention has been accomplished with intent to solve the above-mentioned problem, and a main object of the present invention is to reduce the influence on the heating uniformity of the wafer.

A wafer placement table according to the present invention includes a ceramic base having a wafer placement surface in an upper surface and including an electrode, a cooling base including a coolant flow path formed therein, a bonding layer bonding a lower surface of the ceramic base and an upper surface of the cooling base, a stepped hole penetrating the bonding layer and the cooling base in an up-down direction and including an upper hole portion with a small diameter, a lower hole portion with a large diameter, and a hole stepped portion between the upper hole portion and the lower hole portion, the upper hole portion passing through a region in which the coolant flow path is formed, a stepped insulating pipe inserted through the stepped hole and including an upper pipe portion with a small diameter, a lower pipe portion with a large diameter, and a pipe stepped portion between the upper pipe portion and the lower pipe portion, and a connection terminal bonded at an upper end to the electrode and inserted through the stepped insulating pipe.

In the wafer placement table described above, the stepped hole includes the upper hole portion with the small diameter, and the upper hole portion passes through the region where the coolant flow path is formed. In other words, the large-diameter lower hole portion of the stepped hole is positioned under the coolant flow path. Therefore, the heat removal performance of the coolant flow path is not impaired to a large extent, and the influence upon heating uniformity of the wafer can be reduced.

In this Description, words "up and down", "left and right", "front and back", etc. are used in explanation of the present invention, but "up and down", "left and right", and "front and back" merely indicate relative positional relationships. Thus, when the orientation of the wafer placement table is changed, "up and down" may be changed to "left and right", or "left and right" may be changed to "up and down" in expression of directions. Those cases also fall within the technical scope of the present invention.

In the wafer placement table according to the present invention, a length of the upper hole portion is preferably longer than that of the lower hole portion. As the length of the upper hole portion with the small diameter increases, the influence upon the heating uniformity can be further reduced.

The wafer placement table according to the present invention may include a socket that is arranged inside the lower pipe portion of the stepped insulating pipe and that includes an elastic support elastically supporting an outer peripheral surface of the connection terminal without abutting against a lower end surface of the connection terminal. Since the socket is arranged inside the large-diameter lower pipe portion of the stepped insulating pipe, a diameter of the socket can be set to be greater than a diameter of the upper pipe portion and a diameter of the connection terminal. As a result, a contact surface between the socket and an external contact member is increased, and the occurrence of a connection failure between them can be suppressed. Moreover, even if a force acting in a direction toward the electrode is applied to the socket, the socket does not press the connection terminal because the socket does not abut against the lower end surface of the connection terminal. In addition, the socket elastically supports an outer peripheral surface of the connection terminal without abutting against the lower end surface of the connection terminal. Therefore, the load generated when the external contact member is brought into contact with the socket and the load generated when the connection terminal is connected to the socket are not applied to a location at which the connection terminal and the electrode are bonded to each other, and the occurrence of a defect at the bonded location can be suppressed.

In the wafer placement table including the socket according to the present invention, the socket may be in contact with the pipe stepped portion. With this feature, even if the force acting in the direction toward the electrode is applied to the socket, the force is exerted on the pipe stepped portion and the hole stepped portion, and the socket does not press the connection terminal.

In the wafer placement table including the socket according to the present invention, the elastic support may include a plurality of leaf springs. With this feature, the elastic support can be formed in a relatively simple structure. In that case, the elastic support may include the leaf springs vertically arranged at intervals in a circumferential direction. Alternatively, the elastic support may include a plurality of plate members vertically arranged at intervals in the circumferential direction and an elastic member tightening the plate members from an outer side. With this feature as well, the elastic support can be formed in a relatively simple structure.

In the wafer placement table including the socket according to the present invention, a diameter of the connection terminal may be smaller than or equal to a half of a diameter of the lower surface of the socket. With this feature, the diameter of the connection terminal can be made sufficiently smaller than that of the lower surface (contact surface) of the socket.

In the wafer placement table including the socket according to the present invention, the lower surface of the socket may have a concave shape gradually recessed toward a center from an outer periphery. With this feature, when the external contact member is elastically contacted with the lower surface of the socket, a tip end of the contact member is less likely to deviate from the center of the lower surface of the socket.

In the wafer placement table including the socket according to the present invention, the socket may include a plug insertion opening into which a plug is insertable. With this feature, the plug can be used as the external contact member.

BRIEF DESCRIPTION OF THE DRAWINGS

FIGS. 6A to 6D illustrate manufacturing steps of the wafer placement table 10.

DETAILED DESCRIPTION OF THE INVENTION

Figure 1:
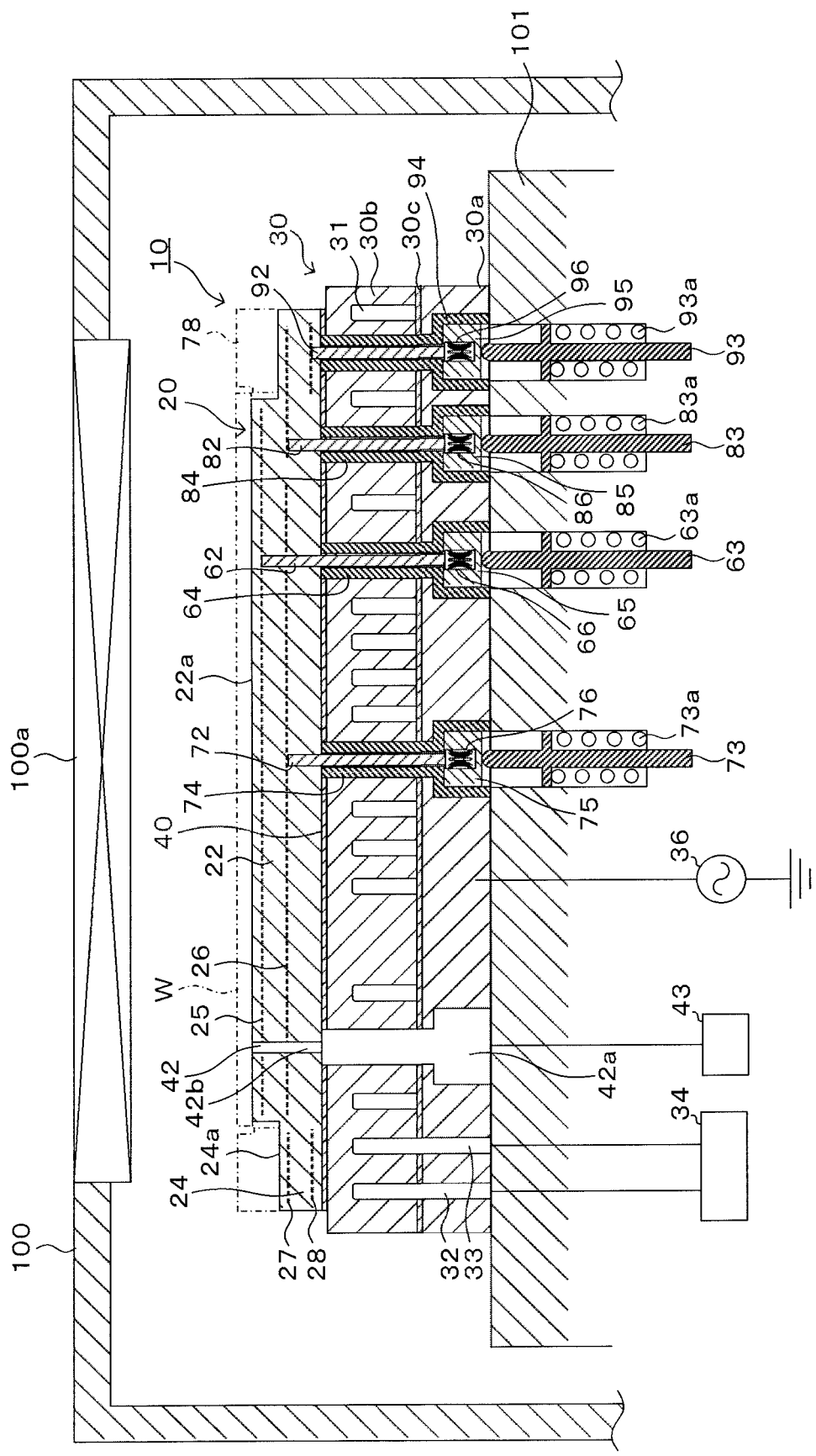
FIG. 1 is a vertical sectional view of a wafer placement table 10 installed in a chamber 100.
Figure 2:
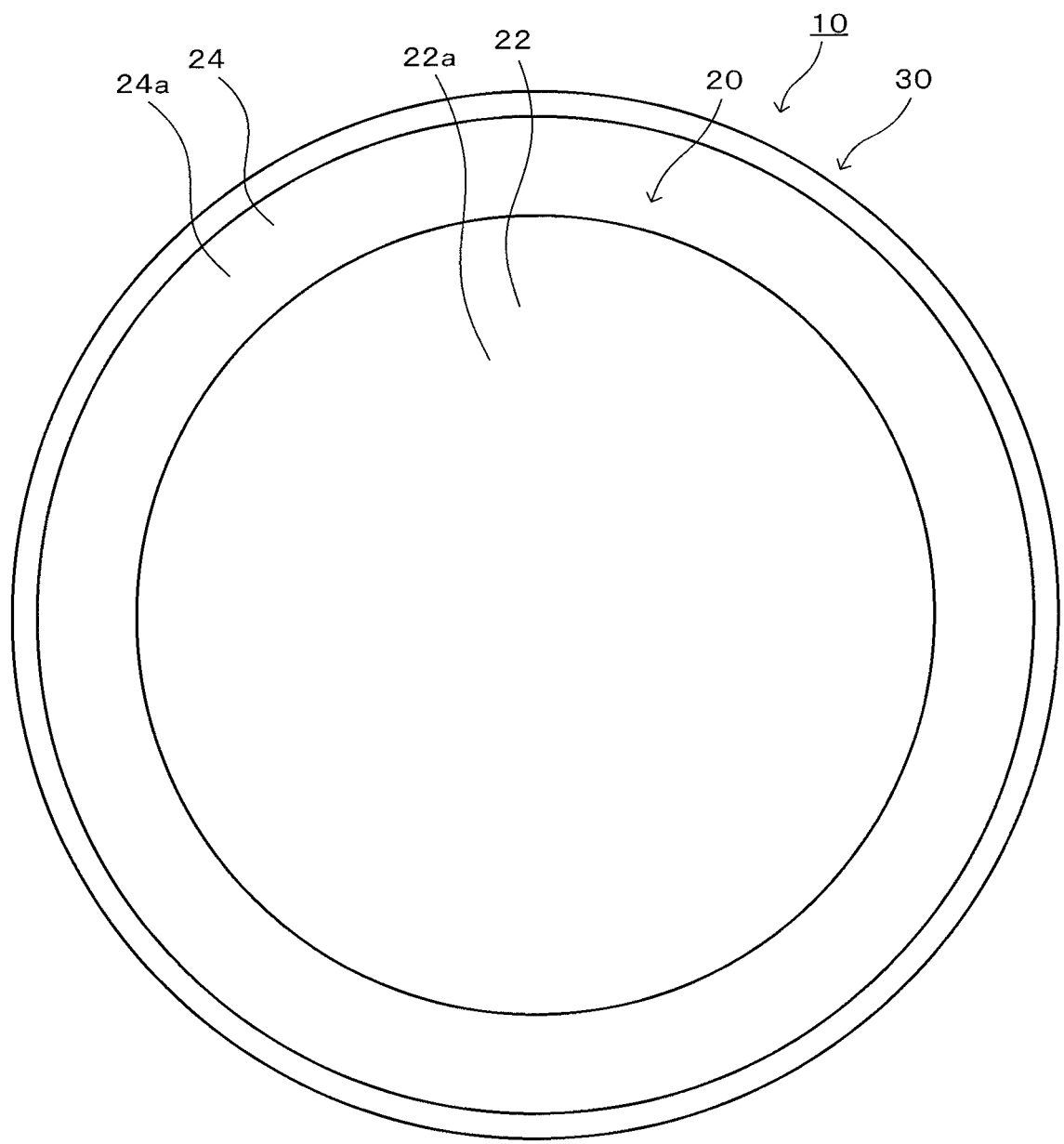
FIG. 2 is a plan view of the wafer placement table 10.
Figure 3:
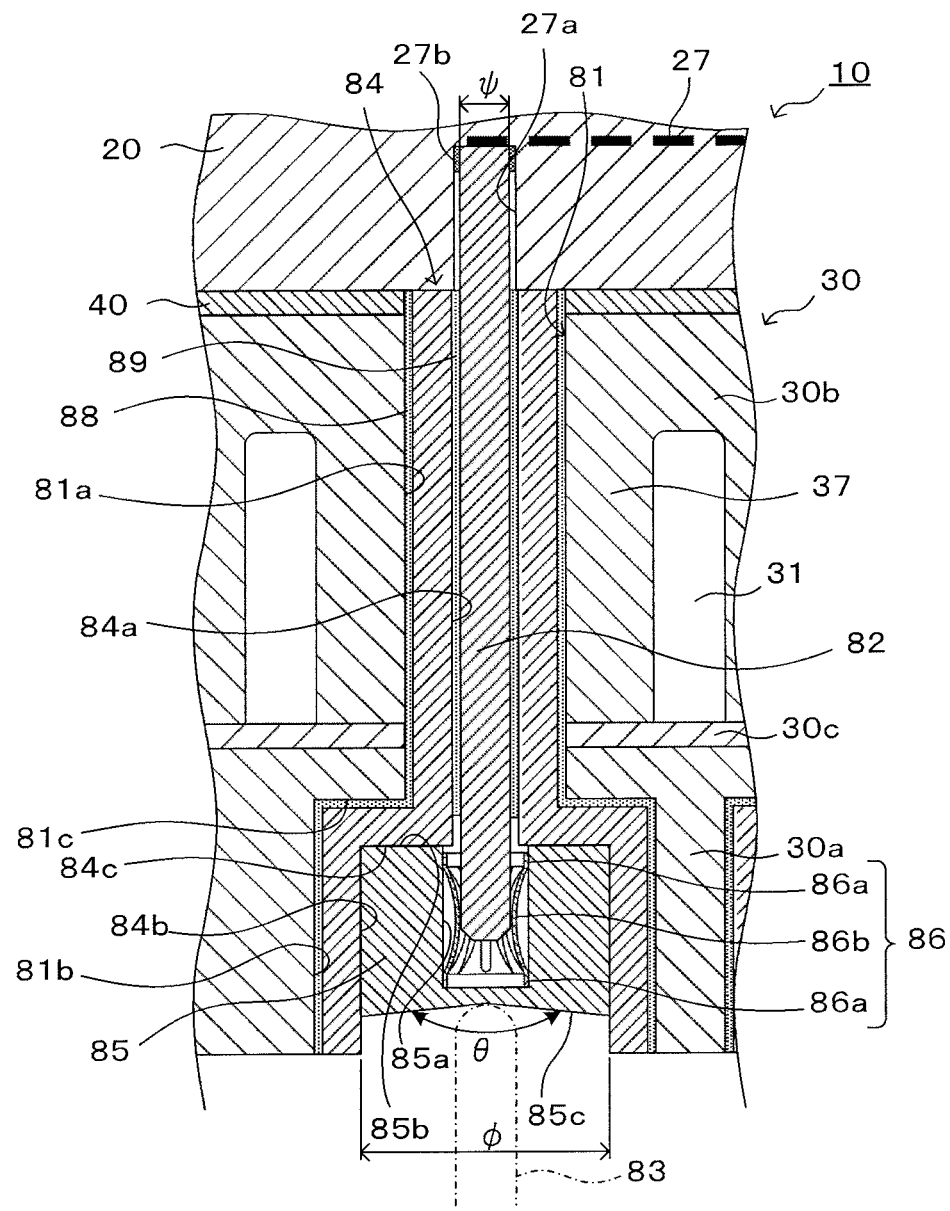
FIG. 3 is a partial enlarged view of FIG. 1.
Figure 4:
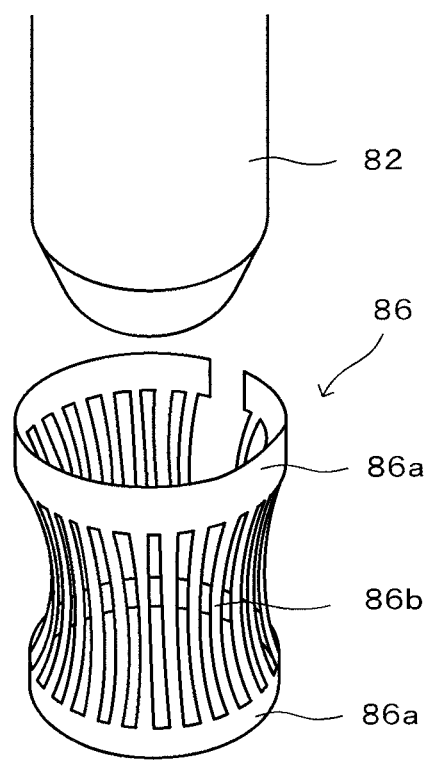
FIG. 4 is a perspective view of a louver 86.

A preferred embodiment of the present invention will be described below with reference to the drawings. FIG. 1 is a vertical sectional view of a wafer placement table 10 installed in a chamber 100 (namely, a sectional view appearing when the wafer placement table 10 is cut along a plane including a center axis), FIG. 2 is a plan view of the wafer placement table 10, FIG. 3 is a partial enlarged view of FIG. 1 (namely, a sectional view of the structure of a socket 85 and its surroundings), and FIG. 4 is a perspective view of a louver 86. In this Description, "A to B" expressing a numerical range is used as indicating that numerical values A and B denoted before and after "to" are included respectively as a lower limit value and an upper limit value of the range.

The wafer placement table 10 is used to perform CVD or etching on a wafer W with plasma and is fixed to a mounting plate 101 that is disposed inside a chamber 100 for a semiconductor process. The wafer placement table 10 includes a ceramic base 20, a cooling base 30, and a metallic bonding layer 40.

The ceramic base 20 includes an outer peripheral portion 24 with an annular focus-ring placement surface 24a around a central portion 22 with a circular wafer placement surface 22a. In the following, "focus ring" is abbreviated to "FR" in some cases. The wafer W is placed on the wafer placement surface 22a, and a focus ring 78 is placed on the FR placement surface 24a. The ceramic base 20 is made of a ceramic material represented by alumina or aluminum nitride, for example. The FR placement surface 24a is one step lower than the wafer placement surface 22a.

A wafer attraction electrode 25 and a central heater electrode 26 are built in the central portion 22 of the ceramic base 20 in order from a side closer to the wafer placement surface 22a. Those electrodes 25 and 26 are made of a material containing W, Mo, WC, or MoC, for example.

The wafer attraction electrode 25 is a single-pole electrostatic electrode in the form of a circular plate or mesh. A layer of the ceramic base 20 on an upper side than the wafer attraction electrode 25 functions as a dielectric layer. A wafer attraction DC power supply (not illustrated) is connected to the wafer attraction electrode 25 through both a power supply terminal (connection terminal) 62 and a power supply rod 63. The power supply terminal 62 is inserted through a stepped insulating pipe 64. The stepped insulating pipe 64 is inserted through a stepped hole penetrating both the cooling base 30 and the bonding layer 40. An upper surface of the power supply terminal 62 is bonded to a lower surface of the wafer attraction electrode 25. A socket 65 is arranged in a diameter-increased lower portion of the stepped insulating pipe 64. A lower portion of the power supply terminal 62 is inserted into a louver 66 that is arranged in a bottom-equipped hole formed in an upper surface of the socket 65, and the lower portion is electrically connected to the socket 65. A lower surface of the socket 65 is in contact with an upper surface of the power supply rod 63 that is biased upward by a spring 63a.

The central heater electrode 26 is formed of a resistance heating element that is wired in a one-stroke pattern to extend over the whole of the wafer placement surface 22a from one end to the other end when viewed in plan. A central heater power supply (not illustrated) is connected to the one end of the central heater electrode 26 through both a power supply terminal 72 and a power supply rod 73. An upper surface of the power supply terminal 72 is bonded to a lower surface of the central heater electrode 26 at the one end thereof. The power supply terminal 72 is inserted through a stepped insulating pipe 74. The stepped insulating pipe 74 is inserted through a stepped hole penetrating both the cooling base 30 and the bonding layer 40. A socket 75 is arranged in a diameter-increased lower portion of the stepped insulating pipe 74. A lower portion of the power supply terminal 72 is inserted into a louver 76 that is arranged in a bottom-equipped hole formed in an upper surface of the socket 75, and the lower portion is electrically connected to the socket 75. A lower surface of the socket 75 is in contact with an upper surface of the power supply rod 73 that is biased upward by a spring 73a. Although not illustrated, the other end of the central heater electrode 26 is also connected to the central heater power supply through both a power supply terminal and a power supply rod as with the one end of the central heater electrode 26.

An FR attraction electrode 27 and an outer peripheral heater electrode 28 are built in the outer peripheral portion 24 of the ceramic base 20 in order from a side closer to the FR placement surface 24a. Those electrodes 27 and 28 are made of a material containing W, Mo, WC, or MoC, for example.

The FR attraction electrode 27 is a single-pole electrostatic electrode in the form of a circular ring-shaped plate or mesh. A layer of the ceramic base 20 on an upper side than the FR attraction electrode 27 functions as a dielectric layer. An FR attraction DC power supply (not illustrated) is connected to the FR attraction electrode 27 through both a power supply terminal 82 and a power supply rod 83. An upper surface of the power supply terminal 82 is bonded to a lower surface of the FR attraction electrode 27. The power supply terminal 82 is inserted through a stepped insulating pipe 84. The stepped insulating pipe 84 is inserted through a stepped hole penetrating both the cooling base 30 and the bonding layer 40. A socket 85 is arranged in a diameter-increased lower portion of the stepped insulating pipe 84. A lower portion of the power supply terminal 82 is inserted into the louver 86 that is arranged in a bottom-equipped hole formed in an upper surface of the socket 85, and the lower portion is electrically connected to the socket 85. A lower surface of the socket 85 is in contact with an upper surface of the power supply rod 83 that is biased upward by a spring 83a.

The outer peripheral heater electrode 28 is formed of a resistance heating element that is wired in a one-stroke pattern to extend over the whole of the FR placement surface 24a from one end to the other end when viewed in plan. An outer peripheral heater power supply (not illustrated) is connected to the one end of the outer peripheral heater electrode 28 through both a power supply terminal 92 and a power supply rod 93. An upper surface of the power supply terminal 92 is bonded to a lower surface of the outer peripheral heater electrode 28 at the one end thereof. The power supply terminal 92 is inserted through a stepped insulating pipe 94. The stepped insulating pipe 94 is inserted through a stepped hole penetrating both the cooling base 30 and the bonding layer 40. A socket 95 is arranged in a diameter-increased lower portion of the stepped insulating pipe 94. A lower portion of the power supply terminal 92 is inserted into a louver 96 that is arranged in a bottom-equipped hole formed in an upper surface of the socket 95, and the lower portion is electrically connected to the socket 95. A lower surface of the socket 95 is in contact with an upper surface of the power supply rod 93 that is biased upward by a spring 93a. Although not illustrated, the other end of the outer peripheral heater electrode 28 is also connected to the outer peripheral power supply through both a power supply terminal and a power supply rod as with the one end of the outer peripheral heater electrode 28.

The stepped insulating pipes 64, 74, 84 and 94 can be formed using a ceramic material such as alumina, for example.

The cooling base 30 is a conductive circular plate member and includes a lower member 30a and an upper member 30b bonded to each other with a conductive bonding layer 30c interposed therebetween. The conductive bonding layer 30c can be made of the same material as that of the metallic bonding layer 40 (described later). The cooling base 30 includes a coolant flow path 31 through which a coolant can circulate. The coolant flow path 31 is formed in a one-stroke pattern to extend over the whole of the ceramic base 20 from one end to the other end when viewed in plan. The coolant flow path 31 is formed by a flow channel groove formed in a lower surface of the upper member 30b and by the bonding layer 30c covering the flow path groove from below. One end of the coolant flow path 31 is in communication with a coolant supply path 32, and the other end is in communication with a coolant discharge path 33. A coolant circulator 34 is a circulation pump with a temperature adjustment function. The coolant circulator 34 introduces the coolant at a temperature adjusted to a desired value to the coolant supply path 32 and, after adjusting the temperature of the coolant discharged from the coolant discharge path 33 of the coolant flow path 31 to the desired value, introduces the discharged coolant again to the coolant supply path 32. The cooling base 30 is made of a conductive material containing a metal. The conductive material may be, for example, a composite material or a metal. The composite material may be a metal matrix composite material (also called a metal matrix composite (MMC)). The MMC may be, for example, a material containing Si, SiC and Ti, and a material made of a SiC porous body impregnated with Al and/or Si. The material containing Si, SiC and Ti is called SiSiCTi, the material made of the SiC porous body impregnated with Al is called AlSiC, and the material made of the SiC porous body impregnated with Si is called SiSiC. The metal may be, for example, Mo. The cooling base 30 is connected to a radio frequency power supply 36 for generating plasma and is used as a radio frequency electrode.

The metallic bonding layer 40 bonds a lower surface of the ceramic base 20 and an upper surface of the cooling base 30. The metallic bonding layer 40 may be a layer made of, for example, a solder or a metallic brazing material. The metallic bonding layer 40 is formed by, for example, TCB (Thermal compression bonding). The TCB indicates a known method of sandwiching a metallic bonding material between two members to be bonded, and press-bonding those two members in a state in which those members are heated to a temperature lower than or equal to the solidus temperature of the metallic bonding material.

The wafer placement table 10 includes a BS gas path 42 through which a backside gas (BS gas) is supplied to a back surface of the wafer W. The BS gas path 42 is constituted by a stepped hole 42a penetrating both the cooling base 30 and the metallic bonding layer 40 in an up-down direction, and by a through-hole 42b communicating with the stepped hole 42a and penetrating the ceramic base 20 in the up-down direction. The BS gas path 42 is connected to a BS gas supply source 43. The BS gas may be, for example, a heat conduction gas (e.g., a He gas).

Structures of the power supply terminals 62, 72, 82 and 92 of the wafer placement table 10 and their surroundings will be described below. Because the structures are common to those power supply terminals, the structure of the power supply terminal 82 and its surroundings are described with reference to FIG. 3 in the following.

The stepped hole 81 is a hole being circular in cross-section and penetrating both the metallic bonding layer 40 and the cooling base 30 in the up-down direction. The stepped hole 81 includes an upper hole portion 81a with a small diameter, a lower hole portion 81b with a large diameter, and a hole stepped portion 81c between the upper hole portion 81a and the lower hole portion 81b. The upper hole portion 81a penetrates the metallic bonding layer 40, the upper member 30b of the cooling base 30, and the conductive bonding layer 30c and further extends up to the lower member 30a. The upper hole portion 81a passes through a region 37 of the cooling base 30 where the coolant flow path 31 is formed (namely, through a wall portion of the cooling base 30 partitioning adjacent parts of the coolant flow path 31) in the up-down direction. The lower hole portion 81b is formed to extend from an outer peripheral position of the hole stepped portion 81c to reach a lower surface of the lower member 30a. A length of the upper hole portion 81a is longer than that of the lower hole portion 81b. Thus, the coolant flow path 31 can be formed in a sufficient height (length in the up-down direction), and the heat removal performance of the coolant flow path 31 is increased.

The stepped insulating pipe 84 is inserted through the stepped hole 81 and is stuck to an inner surface of the stepped hole 81 with a silicone adhesive layer 88 interposed therebetween. An outer shape of the stepped insulating pipe 84 matches with a shape of the stepped hole 81. The stepped insulating pipe 84 includes an upper pipe portion 84a with a small diameter, a lower pipe portion 84b with a large diameter, and a pipe stepped portion 84c between the upper pipe portion 84a and the lower pipe portion 84b. The upper pipe portion 84a is positioned in the upper hole portion 81a, and the lower pipe portion 84b is positioned in the lower hole portion 81b. An outer surface of the pipe stepped portion 84c is stuck to the hole stepped portion 81c with the adhesive layer 88 interposed therebetween.

A terminal hole 27a is formed in the ceramic base 20 over a range from the lower surface of the FR attraction electrode 27 to the lower surface of the ceramic base 20.

The power supply terminal 82 is inserted through both the terminal hole 27a and the upper pipe portion 84a of the stepped insulating pipe 84 and is stuck to an inner surface of the upper pipe portion 84a with a silicone adhesive layer 89 interposed therebetween. The upper surface of the power supply terminal 82 is bonded to the FR attraction electrode 27 with a metallic brazing layer 27b interposed therebetween, and the lower portion of the power supply terminal 82 reaches the inside of the lower pipe portion 84b of the stepped insulating pipe 84.

The socket 85 is a cylindrical member made of a metal (for example, Cu) and is fitted to the lower pipe portion 84b of the stepped insulating pipe 84. The socket 85 has a bottom-equipped hole 85a formed in a central portion of its upper surface. An annular upper surface 85b of the socket 85 abuts against the pipe stepped portion 84c of the stepped insulating pipe 84. A diameter ϕ of a circular lower surface 85c of the socket 85 substantially matches with an inner diameter of the lower pipe portion 84b of the stepped insulating pipe 84. The lower surface 85c is a concave surface gradually recessed toward a center from an outer periphery. A taper angle θ of the concave surface is preferably greater than or equal to 90° and smaller than 180°. The louver 86 made of a metal (for example, beryllium copper) is arranged in the bottom-equipped hole 85a of the socket 85. The louver 86 includes a ring portion 86a in each of upper and lower sides and a plurality of strip members 86b vertically arranged at intervals in a circumferential direction of the ring portion 86a (see FIG. 4). The ring portion 86a is in contact with an inner peripheral wall of the bottom-equipped hole 85a of the socket 85. The ring portion 86a may have an annular shape or a C shape. The strip members 86b couple the upper and lower ring portions 86a to each other and have a shape curving toward a center axis of the louver 86. The lower portion of the power supply terminal 82 is inserted into the louver 86. An outer peripheral surface of the power supply terminal 82 is in contact with the strip members 86b, and a lower end surface of the power supply terminal 82 is apart from a bottom surface of the bottom-equipped hole 85a without abutting against the bottom surface. The strip members 86b are pressed by the power supply terminal 82 outward in a radial direction to come into an elastically deformed state. In other words, the louver 86 elastically supports the outer peripheral surface of the power supply terminal 82 in its lower portion in such a manner that the lower end surface of the power supply terminal 82 does not abut against the bottom surface of the bottom-equipped hole 85a of the socket 85. A relationship between the diameter ϕ of the lower surface of the socket 85 and a diameter ψ of the power supply terminal 82 preferably satisfies ψ≤ϕ/2.

Figure 5A:
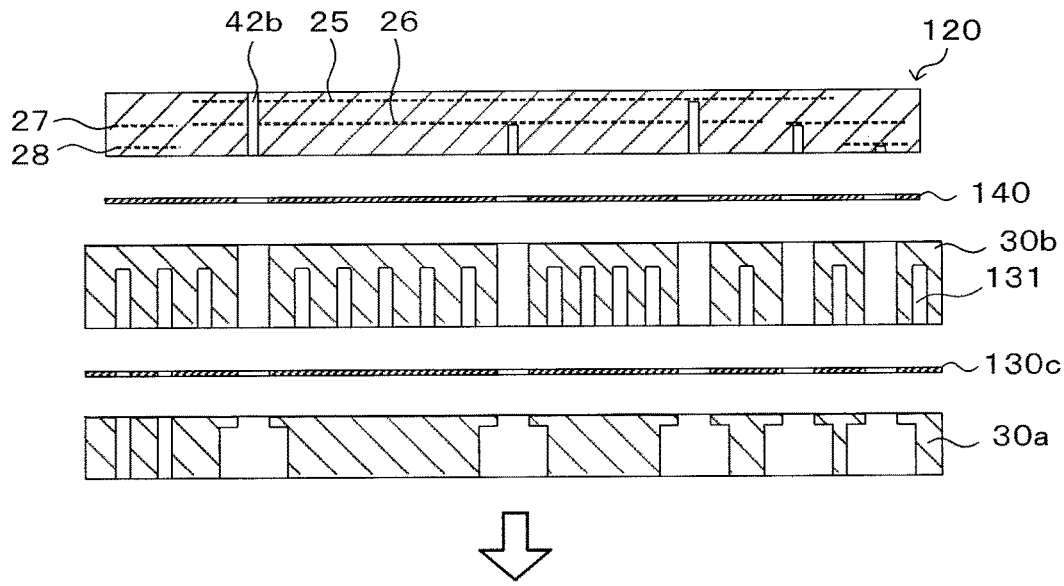
FIGS. 5A to 5C illustrate manufacturing steps of the wafer placement table 10.

An example of manufacturing the wafer placement table 10 will be described below with reference to FIGS. 5 and 6. FIGS. 5 and 6 each illustrate manufacturing steps of the wafer placement table 10. First, a ceramic sintered body 120 in the form of a circular plate becoming the ceramic base 20 is fabricated (FIG. 5A). In more detail, the ceramic sintered body 120 is fabricated by firing a ceramic powder compact with a hot press and then forming various holes by cutting. The wafer attraction electrode 25, the central heater electrode 26, the FR attraction electrode 27, and the outer peripheral heater electrode 28 are built in the ceramic sintered body 120. The various holes provide the through-hole 42b serving as part of the BS gas path 42 and holes through which the power supply terminals 62, 72, 82 and 92 are inserted.

In parallel to the above-mentioned process, the lower member 30a and the upper member 30b are fabricated (FIG. 5A). The coolant supply path 32, the coolant discharge path 33, and holes serving as parts of the stepped holes 42a, 61, 71, 81 and 91 are formed in the lower member 30a by cutting. A flow path groove 131 becoming the coolant flow path 31 and holes serving as parts of the stepped holes 42a, 61, 71, 81 and 91 are formed in the upper member 30b by cutting. When the ceramic sintered body 120 is made of alumina, the lower member 30a and the upper member 30b are preferably made of SiSiCTi or AlSiC. This is because the thermal expansion coefficient of alumina is substantially the same as that of SiSiCTi or AlSiC. When the ceramic sintered body 120 is made of AlN, the lower member 30a and the upper member 30b are preferably made of Mo. This is because the thermal expansion coefficient of AlN is substantially the same as that of Mo.

A circular plate member made of SiSiCTi can be fabricated, by way of example, as follows. First, a powder mixture is prepared by mixing silicon carbide, metal Si, and metal Ti. Next, a compact in the form of a circular plate is fabricated from the obtained power mixture by uniaxial press-molding, and the compact is sintered under an inert atmosphere with a hot press. Thus, the circular plate member made of SiSiCTi is obtained.

A metallic bonding material 130c including through-holes formed at required positions is arranged between the lower member 30a and the upper member 30b, and a metallic bonding material 140 including through-holes formed at required positions is arranged between the upper member 30b and the ceramic sintered body 120 (FIG. 5A). The above-mentioned materials and members are laminated, and a laminate is obtained.

Figure 5B:
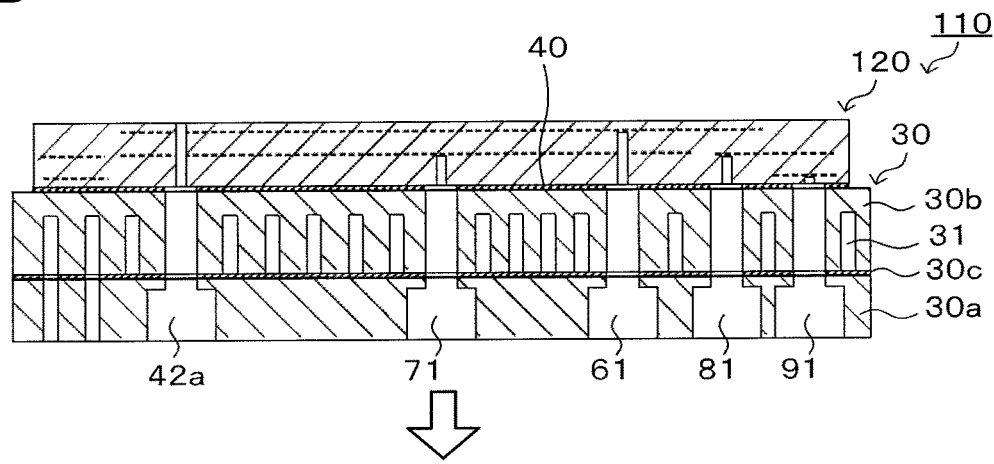

Then, the laminate is pressed under heating (by the TCB), and a bonded body 110 is obtained (FIG. 5B). The bonded body 110 is a body in which the ceramic sintered body 120 is bonded, with interposition of the metallic bonding layer 40, to the upper surface of the cooling base 30 including the lower member 30a and the upper member 30b that are bonded to each other with the conductive bonding layer 30c interposed therebetween. An opening of the flow path groove 131 in the upper member 30b is covered with the conductive bonding layer 30c and the lower member 30a. Thus, the coolant flow path 31 is formed inside the cooling base 30. The stepped holes 42a, 61, 71, 81 and 91 are formed in the metallic bonding layer 40 and the cooling base 30.

The TCB is performed, by way of example, as follows. The laminate is pressed and bonded together at a temperature lower than or equal to the solidus temperature of the metallic bonding material (for example, a temperature higher than or equal to a value obtained by subtracting 20° C. from the solidus temperature and lower than or equal to the solidus temperature). Then, the temperature of the laminate is returned to a room temperature. As a result, the metallic bonding material becomes the metallic bonding layer. An Al—Mg bonding material or an Al—Si—Mg bonding material can be used as the metallic bonding material in the above-mentioned process. When the TCB is performed using the Al—Si—Mg bonding material, for example, the laminate is pressed in a state heated under a vacuum atmosphere. The metallic bonding material used here preferably has a thickness of about 100 μm.

Figure 5C:
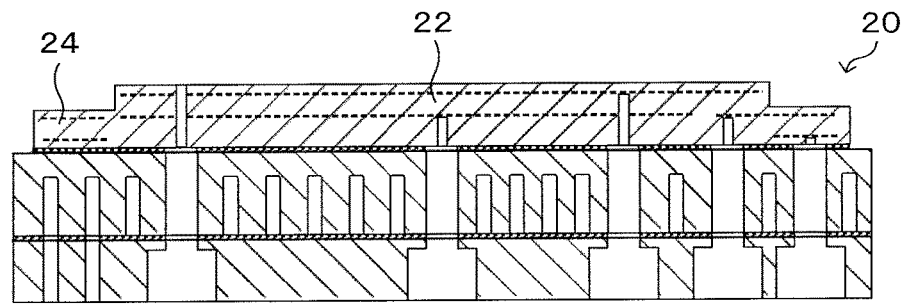

Then, an outer peripheral portion of the ceramic sintered body 120 is cut to form a step, whereby the ceramic base 20 including the central portion 22 and the outer peripheral portion 24 is obtained (FIG. 5C).

Then, the wafer placement table 10 is obtained by attaching necessary members to the stepped holes 61, 71, 81 and 91. The following description is made, by way of example, in connection with the case of attaching the necessary members to the stepped hole 81. To the other stepped holes 61, 71 and 91 as well, necessary members are attached in a similar manner.

First, the upper surface of the power supply terminal 82 is bonded through the terminal hole 27a extending from the lower surface of the ceramic base 20 to the FR attraction electrode 27 by using a metallic brazing material, whereby the power supply terminal 82 and the FR attraction electrode 27 are bonded to each other with the metallic brazing layer 27b interposed therebetween (FIGS. 6A and 6B). For instance, the power supply terminal 82 made of Mo is bonded to the FR attraction electrode 27 made of WC or Mo by using the metallic bonding material (for example, Au—Ge, Al, or Ag).

Then, a silicone adhesive is applied to an outer peripheral surface of the stepped insulating pipe 84 and an inner peripheral surface of the small-diameter upper pipe portion 84a. Thereafter, the stepped insulating pipe 84 is inserted through the stepped hole 81 while the power supply terminal 82 is inserted through the stepped insulating pipe 84. The adhesive is then solidified to form the adhesive layers 88 and 89 (FIGS. 6B and 6C). A lower end of the power supply terminal 82 is in a state projecting into the inside of the large-diameter lower pipe portion 84b.

Then, the socket 85 with the louver 86 is prepared and assembled into the large-diameter lower pipe portion 84b of the stepped insulating pipe 84 while the power supply terminal 82 is inserted into the louver 86 (FIGS. 6C and 6D). At that time, even if a force acting in a direction toward the FR attraction electrode 27 is applied to the socket 85, the force is exerted on the pipe stepped portion 84c and the hole stepped portion 81c because the socket 85 does not abut against the lower end surface of the power supply terminal 82. Therefore, the socket 85 does not press the power supply terminal 82. In addition, the louver 86 in the socket 85 elastically supports the outer peripheral surface of the power supply terminal 82 without abutting against the lower end surface of the power supply terminal 82. Therefore, the load generated when the power supply terminal 82 is connected to the louver 86 in the socket 85 is not applied to the metallic brazing layer 27b at which the power supply terminal 82 and the FR attraction electrode 27 are bonded to each other.

The necessary members are attached to the other stepped holes 61, 71 and 91 as well in a similar manner. Thus, the wafer placement table 10 is obtained.

An example of use of the wafer placement table 10 will be described below with reference to FIG. 1. The wafer placement table 10 is set, as described above, on the mounting plate 101 in the chamber 100. A shower head 100a discharging a process gas toward the inside of the chamber 100 from many gas injection holes is arranged at a ceiling surface of the chamber 100.

The focus ring 78 is placed on the FR placement surface 24a of the wafer placement table 10, and the wafer W in the form of a disk is placed on the wafer placement surface 22a. The focus ring 78 includes a step formed along an inner periphery of its upper end portion not to interfere with the wafer W. In this state, a DC voltage is applied to the wafer attraction electrode 25 to attract the wafer W onto the wafer placement surface 22a, and a DC voltage is applied to the FR attraction electrode 27 to attract the focus ring 78 onto the FR placement surface 24a. Furthermore, the BS gas (for example, a helium gas) is supplied to the back surface of the wafer W from the BS gas path 42, and currents are supplied to the central heater electrode 26 and the outer peripheral heater electrode 28 to make control such that the wafer W is heated to a high temperature. Then, the inside of the chamber 100 is held under a predetermined vacuum atmosphere (or a reduced-pressure atmosphere), and a radio frequency voltage from the radio frequency power supply 36 is applied to the cooling base 30 while the process gas is supplied from the shower head 100a. As a result, plasma is generated between the cooling base 30 and the shower head 100a. The wafer W is processed with the generated plasma. The temperature of the wafer W is adjusted as required by circulating the coolant through the coolant flow path 31.

In the above-described wafer placement table 10 according to this embodiment, the stepped hole 81 includes the upper hole portion 81a with the small diameter, and the upper hole portion 81a passes through the region 37 of the cooling base 30 where the coolant flow path 31 is formed (namely, through the wall portion of the cooling base 30 partitioning the adjacent parts of the coolant flow path 31). In other words, the large-diameter lower hole portion 81b of the stepped hole 81 is positioned under the coolant flow path 31. Accordingly, the heat removal performance of the coolant flow path 31 is not impaired to a large extent, and the influence upon heating uniformity of the wafer W can be reduced.

Furthermore, since the length of the upper hole portion 81a is longer than that of the lower hole portion 81b, the influence upon the heating uniformity can be further reduced.

Since the socket 85 is arranged inside the large-diameter lower pipe portion 84b of the stepped insulating pipe 84, the diameter φ of the lower surface of the socket 85 can be set to be greater than the diameter of the upper pipe portion 84a and the diameter ψ of the power supply terminal 82. As a result, a contact surface between the lower surface of the socket 85 and the power supply rod 83 serving as an external contact member is increased, and the occurrence of a connection failure between them can be suppressed. Moreover, even if the force acting in the direction toward the FR attraction electrode 27 is applied to the socket 85, the socket 85 does not press the power supply terminal 82 because the socket 85 does not abut against the lower end surface of the power supply terminal 82. In addition, the louver 86 in the socket 85 elastically supports the outer peripheral surface of the power supply terminal 82 without abutting against the lower end surface of the power supply terminal 82. Therefore, the load generated when the power supply rod 83 is brought into contact with the socket 85 and the load generated when the power supply terminal 82 is connected to the socket 85 are not applied to the metallic brazing layer 27b at which the power supply terminal 82 and the FR attraction electrode 27 are bonded to each other, and the occurrence of a defect in the metallic brazing layer 27b can be suppressed.

Because of the socket 85 being in contact with the pipe stepped portion 84c, even if the force acting in the direction toward the FR attraction electrode 27 is applied to the socket 85, the force is exerted on the pipe stepped portion 84c and the hole stepped portion 81c, and the socket 85 does not press the power supply terminal 82.

Furthermore, the strip members 86b (leaf springs) are used as an elastic support. More specifically, the louver 86 including the strip members 86b (leaf springs) vertically arranged at intervals in the circumferential direction is employed as the elastic support. Therefore, the elastic support can be formed in a relatively simple structure.

The diameter $\psi$ of the power supply terminal 82 is preferably set to be smaller than or equal to a half of the diameter $\phi$ of the lower surface 85c of the socket 85 (i.e., $\psi \leq \phi/2$). This condition enables the diameter of the power supply terminal 82 to be held sufficiently smaller than that of the lower surface 85c (contact surface) of the socket 85. As a result, a reduction in heating uniformity of the wafer W due to the presence of the power supply terminal 82 can be sufficiently suppressed.

The lower surface 85c of the socket 85 has a concave shape gradually recessed toward the center from the outer periphery. Accordingly, when the external power supply rod 83 is elastically contacted with the lower surface 85c of the socket 85 by the spring 83a, a tip end of the power supply rod 83 is less likely to deviate from the center of the lower surface 85c of the socket 85.

The above-mentioned various advantageous effects can be obtained with not only the structure of the power supply terminal 82 and its surroundings illustrated in FIG. 3, but also the structures of the power supply terminals 62, 72 and 92 and their surroundings, those structures being each similar to the structure of the power supply terminal 82 and its surroundings.

It is needless to say that the present invention is not limited to the above-described embodiment and can be implemented in various forms insofar as those forms fall within the technical scope of the present invention.

Figure 7:
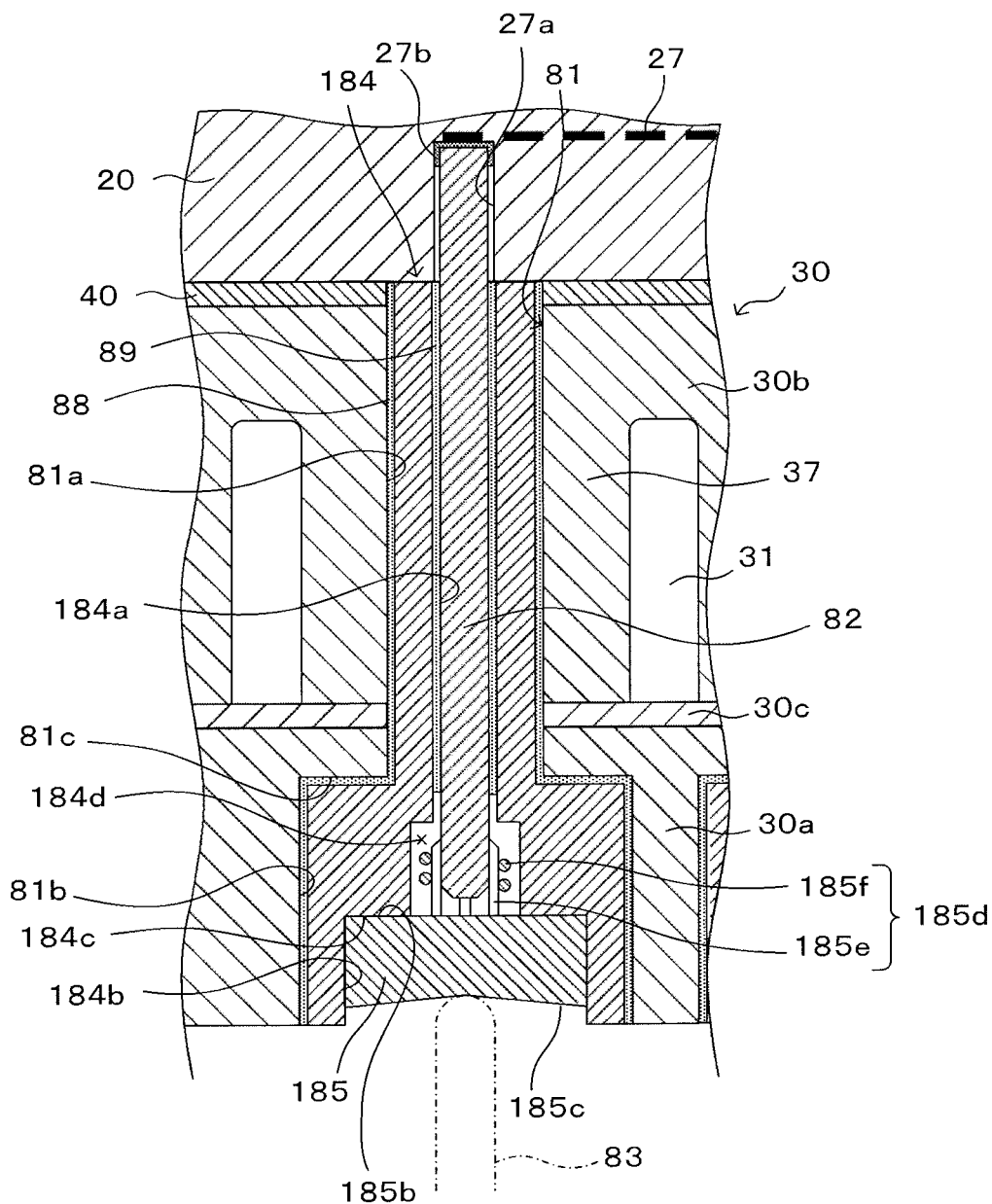
FIG. 7 is a sectional view of the structure of a socket 185 and its surroundings.
Figure 8:
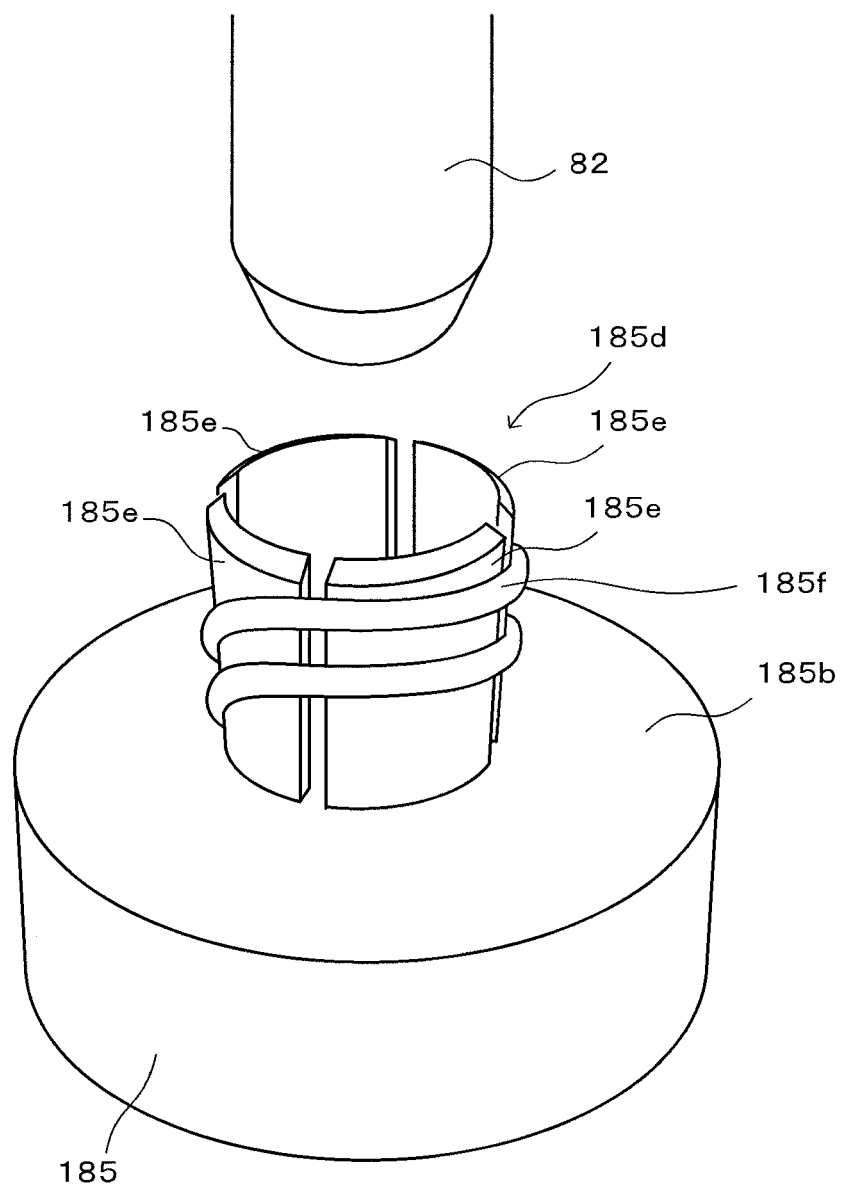
FIG. 8 is a perspective view of the socket 185.

For instance, while the socket 85 including the louver 86 assembled thereinto is used in the above-described embodiment, a socket 185 illustrated in FIGS. 7 and 8 may be used instead. FIG. 7 is a sectional view of the structure of the socket 185 and its surroundings, and FIG. 8 is a perspective view of the socket 185. In FIG. 7, components similar to the above-described embodiment are denoted by the same reference signs, and description of those components is omitted. A stepped insulating pipe 184 is inserted through the stepped hole 81 and has an outer shape in match with the shape of the stepped hole 81. The stepped insulating pipe 184 includes an upper pipe portion 184a with a small diameter, a lower pipe portion 184b with a large diameter, and a pipe stepped portion 184c between the upper pipe portion 184a and the lower pipe portion 184b. The pipe stepped portion 184c abuts against an upper surface 185b of the socket 185. A space 184d in which an elastic support 185d is to be accommodated is formed at a boundary between the upper pipe portion 184a and the pipe stepped portion 184c. The elastic support 185d includes a plurality of plate members 185e vertically arranged at intervals in the circumferential direction and an outer spring (elastic member) 185f tightening the plate members 185e from the outer side. The plate members 185e are made of a metal and are members obtained by dividing a cylinder into plural parts (four here) by vertical slits, each of the members having a circular arc shape in cross-section (FIG. 8). A lower end of each plate member 185e is a fixed end integrated with the socket 185, and an upper end of the plate member 185e is a free end. The outer spring 185f is a metal-made spring and is preferably made of a nonmagnetic metallic material (for example, Inconel) or a metallic material that is not magnetized at high temperature. The diameter of a circle along which the plate members 185e are arranged is a little smaller than that of the power supply terminal 82. Accordingly, when the power supply terminal 82 is inserted into a space at a center of the elastic support 185d, the plate members 185e are pushed to expand outward in the radial direction, but the outer spring 185f tightens the plate members 185e and the power supply terminal 82 from the outer side. As a result, the power supply terminal 82 is elastically supported by the elastic support 185d. On that occasion, the lower end surface of the power supply terminal 82 is apart from the upper surface 185b of the socket 185 (namely, it does not abut against the upper surface 185b of the socket 185). A lower surface 185c of the socket 185 has a concave shape gradually recessed toward a center from an outer periphery, and the power supply rod 83 abuts against the center of the lower surface 185c. With the structure described above, similar advantageous effects to those in the above-described embodiment can also be obtained. When the elastic support 185d can elastically support the power supply terminal 82 without the outer spring 185f, the outer spring 185f may be omitted. A similar structure to that illustrated in FIG. 7 may be applied to the structures of the power supply terminals 62, 72 and 92 as well.

Figure 9:
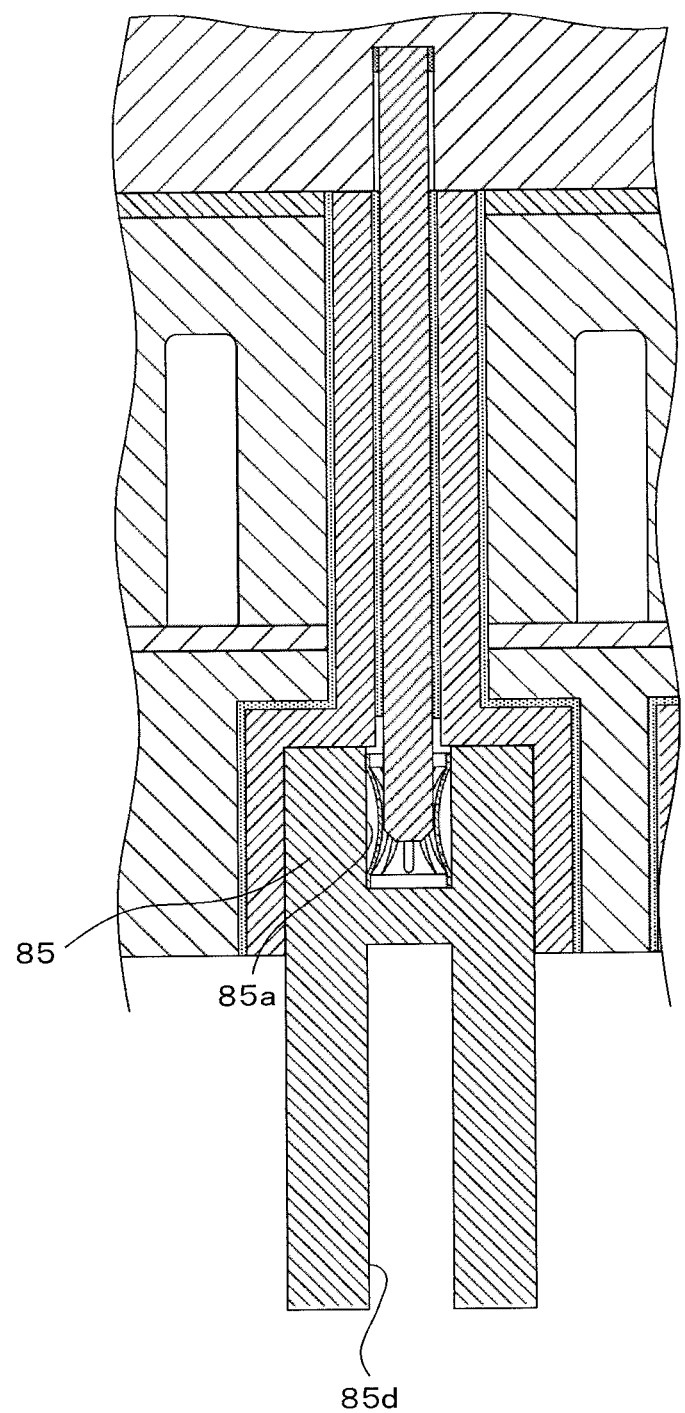
FIG. 9 is a sectional view illustrating another example of the socket 85.

The structure of elastically contacting the power supply rod 83 with the lower surface 85c of the socket 85 is used, by way of example, in the above-described embodiment. However, as illustrated in FIG. 9, a plug insertion opening 85d may also be formed in the socket 85 on an opposite side to the bottom-equipped hole 85a, and a power supply plug (for example, a banana plug) may be inserted as an external contact member into the plug insertion opening 85d. Such a structure can also provide similar advantageous effects to those in the above-described embodiment.

While the above-described embodiment represents the example in which the wafer attraction electrode 25, the central heater electrode 26, the FR attraction electrode 27, and the outer peripheral heater electrode 28 are built in the ceramic base 20, there is no specific reason to limit the present invention to that example. At least one of the above-mentioned electrodes may be built in the ceramic base 20. Moreover, an RF electrode may be built in the ceramic base 20. In that case, structures of a power supply terminal, a power supply rod, and so on connected to the RF electrode may be formed as with the structures illustrated in FIG. 3.

The wafer placement table 10 in the above-described embodiment may include a lift pin hole through which a lift pin (not illustrated) for moving the wafer W up and down relative to the wafer placement surface 22a is to be inserted. The lift pin hole is a hole penetrating the wafer placement table 10 in the up-down direction.

While, in the above-described embodiment, the ceramic base 20 and the cooling base 30 are bonded to each other with the metallic bonding layer 40 interposed therebetween, a resin bonding layer may be used instead of the metallic bonding layer 40. In that case, the upper pipe portions of the stepped insulating pipes 64, 74, 84 and 94 may or may not be inserted into holes in the resin bonding layer. In consideration of thermal conductivity, however, using the metallic bonding layer 40 is more desirable than using the resin bonding layer.

In the above-described embodiment, the lower end of the power supply terminal 82 may be formed flat, a pair of flat springs may be disposed on the socket 85 instead of the louver 86, and the lower end of the power supply terminal 82 may be sandwiched between the pair of flat springs.

The present application claims priority from Japanese Patent Application No. 2021-171041, filed on Oct. 19, 2021, the entire contents of which are incorporated herein by reference.

What is claimed is:

1. A wafer placement table comprising:
    a ceramic base having a wafer placement surface in an upper surface and including an electrode;
    a cooling base including a coolant flow path formed therein;
    a bonding layer bonding a lower surface of the ceramic base and an upper surface of the cooling base;
    a stepped hole penetrating the bonding layer and the cooling base in an up-down direction and including an upper hole portion with a small diameter, a lower hole portion with a large diameter, and a hole stepped portion between the upper hole portion and the lower hole portion, the small diameter upper hole portion passing through a region in which the coolant flow path is formed and the large diameter lower hole portion positioned under the coolant flow path;
    a stepped insulating pipe inserted through the stepped hole and including an upper pipe portion with a small diameter, a lower pipe portion with a large diameter, and a pipe stepped portion between the upper pipe portion and the lower pipe portion; and
    a connection terminal bonded at an upper end to the electrode and inserted through the stepped insulating pipe; and
    wherein a diameter of the connection terminal is less than or equal to half of a diameter of the lower pipe portion.

2. The wafer placement table according to claim 1, wherein a length of the upper hole portion is longer than a length of the lower hole portion.

3. The wafer placement table according to claim 1, wherein the wafer placement table comprises a socket that is arranged inside the lower pipe portion of the stepped insulating pipe and that includes an elastic support elastically supporting an outer peripheral surface of the connection terminal without abutting against a lower end surface of the connection terminal.

4. The wafer placement table according to claim 3, wherein the socket is in contact with the pipe stepped portion.

5. The wafer placement table according to claim 3, wherein the elastic support includes a plurality of leaf springs.

6. The wafer placement table according to claim 5, wherein the leaf springs are vertically arranged at intervals in a circumferential direction.

7. The wafer placement table according to claim 3, wherein the elastic support includes a plurality of plate members vertically arranged at intervals in a circumferential direction and an elastic member tightening the plate members from an outer side.

8. The wafer placement table according to claim 3, wherein a diameter of the connection terminal is smaller than or equal to a half of a diameter of a lower surface of the socket.

9. The wafer placement table according to claim 3, wherein a lower surface of the socket has a concave shape gradually recessed toward a center from an outer periphery.

10. The wafer placement table according to claim 3, wherein the socket includes a plug insertion opening into which a plug is insertable.

* * * * *